US009630411B2

(12) United States Patent
Van Der Sluis et al.

(10) Patent No.: US 9,630,411 B2
(45) Date of Patent: Apr. 25, 2017

(54) METHOD OF IMPROVING THE YIELD OF A NOZZLE PLATE FABRICATION PROCESS

(75) Inventors: Paul Van Der Sluis, Eindhoven (NL); Alwin Rogier Martijn Verschueren, 'S-Hertogenbosch (NL); Adrianus Antonius Johannes Op 't Hoog, St. Michielsgestel (NL); Jeroen Herman Lammers, Eindhoven (NL)

(73) Assignee: KONINKLIJKE PHILIPS N.V., Eindhoven (NL)

( * ) Notice: Subject to any disclaimer, the term of this patent is extended or adjusted under 35 U.S.C. 154(b) by 248 days.

(21) Appl. No.: 14/113,826

(22) PCT Filed: Apr. 17, 2012

(86) PCT No.: PCT/IB2012/051905

§ 371 (c)(1), (2), (4) Date: Oct. 25, 2013

(87) PCT Pub. No.: WO2012/147009

PCT Pub. Date: Nov. 1, 2012

(65) Prior Publication Data

US 2014/0047714 A1 Feb. 20, 2014

(30) Foreign Application Priority Data

Apr. 27, 2011 (EP) .................................... 11163885

(51) Int. Cl.
*G01R 31/28* (2006.01)
*B41J 2/16* (2006.01)

(52) U.S. Cl.
CPC ............ *B41J 2/162* (2013.01); *B41J 2/1625* (2013.01); *Y10T 29/49401* (2015.01); *Y10T 29/53* (2015.01)

(58) Field of Classification Search
CPC ........ B41J 2/162; B41J 2/1625; B41J 2/1629; Y10T 29/49004; Y10T 29/49226;
(Continued)

(56) References Cited

U.S. PATENT DOCUMENTS 5,167,776 A 12/1992 Bhaskar
6,022,752 A 2/2000 Hirsh et al.
(Continued)

FOREIGN PATENT DOCUMENTS

CN 101323206 A 12/2008
JP 2002144583 A 5/2002

*Primary Examiner* — Paul D Kim
(74) *Attorney, Agent, or Firm* — Michael W. Haas

(57) ABSTRACT

There is provided a method of improving the yield of a nozzle plate fabrication process, the method comprising determining a variation in the size of nozzles in a nozzle plate from a predetermined size or range of sizes for the nozzles, the nozzles in the nozzle plate having been fabricated using a plurality of mandrels, each mandrel defining a respective nozzle in the nozzle plate and determining modifications to the size of one or more mandrels in the plurality of mandrels to compensate for the determined variation in the size of nozzles in the nozzle plate. Also provided is a method of fabricating a nozzle plate, the method comprising fabricating a nozzle plate having a plurality of nozzles using a plurality of mandrels on a substrate, each mandrel defining a respective nozzle in the nozzle plate, the mandrels in the plurality of mandrels having varying sizes in order to compensate for local variations in the fabrication process that would result in local variations in the size of nozzles in the nozzle plate from a predetermined size or range of sizes.

9 Claims, 7 Drawing Sheets

(58) Field of Classification Search

CPC ......... Y10T 29/49401; Y10T 29/53022; Y10T 29/53443

USPC ......... 29/593, 739, 740, 742, 743, 833, 834, 29/836; 414/737, 751.1, 752.1; 700/121

See application file for complete search history.

(56) References Cited

U.S. PATENT DOCUMENTS

| | | | | |
|---|---|---|---|---|
| 6,179,978 | B1 | 1/2001 | Hirsh et al. | |
| 6,641,246 | B2 | 11/2003 | Endo et al. | |
| 6,663,231 | B2 * | 12/2003 | Lee | B41J 2/1433 347/68 |
| 8,551,351 | B2 | 10/2013 | Nakamoto | |
| 2005/0086805 | A1 | 4/2005 | Bergstrom et al. | |
| 2007/0076053 | A1 | 4/2007 | Hart et al. | |
| 2008/0041768 | A1 | 2/2008 | Rebinsky | |
| 2008/0136869 | A1 * | 6/2008 | Morgan | B41J 2/02 347/47 |
| 2009/0223539 | A1 * | 9/2009 | Gibbel | H01L 31/18 134/2 |
| 2009/0250162 | A1 | 10/2009 | Rivas et al. | |
| 2010/0152316 | A1 * | 6/2010 | Cornell | B41J 2/1606 522/170 |
| 2014/0346245 | A1 * | 11/2014 | Van Der Sluis | A61M 11/005 239/4 |

* cited by examiner

METHOD OF IMPROVING THE YIELD OF A NOZZLE PLATE FABRICATION PROCESS

CROSS-REFERENCE TO PRIOR APPLICATIONS

This application is the U.S. National Phase application under 35 U.S.C. §371 of International Application Serial No. PCT/IB2012/051905, filed on Apr. 17, 2012, which claims the benefit of European Application Serial No. 11163885.4, filed on Apr. 27, 2011. These applications are hereby incorporated by reference herein.

TECHNICAL FIELD OF THE INVENTION

The invention relates to a nozzle plate for a nebulizer that nebulizes a liquid stored therein into fine droplets, and in particular relates to a method for improving the yield of a nozzle plate fabrication process, an apparatus for implementing the same, a method of fabricating a nozzle plate and a nozzle plate fabricated according to the method.

BACKGROUND TO THE INVENTION

Nebulizers, or atomizers as they are sometimes called, are devices that generate a fine spray or aerosol from a liquid. A particularly useful application for nebulizers is to provide a fine spray containing a dissolved or a suspended particulate drug for administration to a patient by inhalation.

Piezo-mesh based nebulizers are commonly used to generate aerosols in such drug delivery apparatus, whereby a piezoelectric element vibrates the liquid or a mesh or nozzle plate to produce the fine aerosol spray. In the latter case, droplets dispensed on the nozzle plate are vibrated by the piezoelectric element to create the spray.

FIG. 1 shows an exemplary nebulizer 2. The nebulizer 2 comprises a body 4 having an inlet 6 and an outlet 8 arranged so that when a user of the nebulizer 2 inhales through the outlet 8, air is drawn into and through the nebulizer 2 via the inlet 6 and outlet 8 and into the user's body. The outlet 8 is typically provided in the form of a mouthpiece or a facial or nasal mask or in a form that is suitable for connection to a separate replaceable mouthpiece or facial or nasal mask.

The nebulizer 2 comprises a reservoir chamber 10 between the inlet 6 and outlet 8 for storing a liquid 12, for example a medication or drug, to be nebulized (i.e. to be turned into a fine mist or spray). The nebulizer 2 is configured such that fine droplets of the nebulized liquid 12 combine with the air drawn through the nebulizer 2 when the user inhales to deliver a dose of the medication or drug to the user.

An actuator 14 such as a piezoelectric element is provided for agitating or vibrating the liquid 12 stored in the reservoir chamber 10 along with a nozzle plate 16 for nebulizing the liquid 12 when the liquid 12 is vibrated.

The nozzle plate 16 is typically in the form of a mesh or membrane having a plurality of small holes or nozzles through which small amounts of the liquid can pass.

In order for a particular medicine to be therapeutically effective when inhaled, the aerosol droplet size of the medicine must be within a narrow therapeutic range. This narrow range requires droplet sizes that are generated across the surface of the nozzle plate 16 to be substantially uniform. The size of the droplets is determined by the size of the nozzles in the nozzle plate 16. Ideally, each nozzle in the nozzle plate 16 should have the same size. Therefore, there are very fine tolerances on the size of the nozzles. Typically, it is desirable for the nozzles to have a diameter of 2.5 μm with a tolerance of +/−0.25 μm. There can be of the order of 5000 nozzles in a typical nozzle plate 16.

FIG. 2 is diagram illustrating the fabrication of a nozzle plate 16 according to a conventional fabrication process. The nozzle plate 16 is fabricated by depositing or growing a material 18 (such as a metal) on a substrate 20 around a plurality of mandrels 22 (only one of which is shown in FIG. 2). Metal 18 is deposited on the substrate 20 until it 'spills over' the top of each mandrel 22 (the 'spill over' portions being labeled 18' and 18") and forms a nozzle 24 generally in the middle of the mandrel 22. The mandrel 22 and substrate 20 are removed leaving a nozzle plate 16.

It can be seen that the size (diameter d) of the nozzle 24 obtained by the fabrication process is dependent on the thickness t of the metal 18 over the top of the mandrel 22, and therefore small variations to the growth of the metal layer 18 from a desired amount can result in large variations in the size of the nozzle 24. In addition, there can be local variations in the growth of the metal layer 18 across a nozzle plate 16 and also across multiple nozzle plates 16 on a substrate 20.

For example, if a typical overgrowth thickness t of the metal layer 18 on the mandrel 22 is 30 μm and a target diameter for the nozzle 24 is 2.5 μm, a 2% error in local thickness will result in a nozzle diameter variation of twice 2% of 30 μm, which is 1.2 μm. This equates to a relative error in the size of the nozzle 24 of (1.2/2.5)=48%, which is not acceptable. In fact, in practice it is difficult to achieve just a 2% variation in local thickness t.

To mitigate these difficulties, conventional techniques exert precise control over the processing conditions and attempt to equalize these conditions for all nozzles being formed on a substrate. However, even with this precise control, the production yield of a nozzle plate fabrication process is only around 10%.

There is therefore a need for a method for improving the yield of a nozzle plate fabrication process and an apparatus for implementing the same.

SUMMARY OF THE INVENTION

According to a first aspect of the invention, there is provided a method of improving the yield of a nozzle plate fabrication process, the method comprising determining a variation in the size of nozzles in a nozzle plate from a predetermined size or range of sizes for the nozzles, the nozzles in the nozzle plate having been fabricated using a plurality of mandrels, each mandrel defining a respective nozzle in the nozzle plate; and determining modifications to the size of one or more mandrels in the plurality of mandrels to compensate for the determined variation in the size of nozzles in the nozzle plate.

In one embodiment, the step of determining modifications comprises increasing the size of mandrels that define nozzles having a size below the predetermined size or range of sizes and decreasing the size of mandrels that define nozzles having a size above the predetermined size or range of sizes.

In an embodiment, the step of determining modifications comprises determining an amount by which to increase or decrease the size of a mandrel as that corresponding to the amount by which the respective nozzle in the nozzle plate differs from the predetermined size or range of sizes for the nozzle.

In an embodiment, during a nozzle plate fabrication process, the mandrels are formed on a substrate using a mask, and the step of determining modifications comprises determining modifications to the mask used to form the mandrels.

In that embodiment, the step of determining modifications can comprise determining modifications to the area of the mask corresponding to the relevant mandrel.

In some embodiments, the step of determining a variation in the size of nozzles in the nozzle plate comprises illuminating the nozzle plate with light; detecting the light transmitted through one or more nozzles in the nozzle plate; and analyzing the detected light to determine a size of the one or more nozzles.

In those embodiments, the step of detecting can comprise detecting the light transmitted through a plurality of nozzles in the nozzle plate, the plurality of nozzles being distributed across the nozzle plate; and wherein the step of analyzing the detected light comprises analyzing the light detected for each of the plurality of nozzles to determine the variation in the size of the plurality of nozzles across the nozzle plate.

Preferably, the method further comprises the step of fabricating a nozzle plate having a plurality of nozzles using a plurality of mandrels on a substrate, the mandrels in the plurality of mandrels having a size as determined in the step of determining modifications.

According to a second aspect of the invention, there is provided a method of fabricating a nozzle plate, the method comprising fabricating a nozzle plate having a plurality of nozzles using a plurality of mandrels on a substrate, each mandrel defining a respective nozzle in the nozzle plate, the mandrels in the plurality of mandrels having varying sizes in order to compensate for local variations in the fabrication process that would result in local variations in the size of nozzles in the nozzle plate from a predetermined size or range of sizes.

In one embodiment, mandrels have a larger size to compensate for local variations in the fabrication process that would result in the size of nozzles defined thereby being below the predetermined size or range of sizes and mandrels have a smaller size to compensate for local variations in the fabrication process that would result in the size of nozzles defined thereby being above the predetermined size or range of sizes.

In an embodiment, mandrels are sized according to the amount by which the respective nozzle in the nozzle plate defined thereby would differ from the predetermined size or range of sizes for the nozzle.

Preferably, the step of fabricating a nozzle plate comprises depositing material on the substrate around the mandrels, and wherein the local variations in the fabrication process comprise local variations in the thickness of the material around the mandrels.

According to a third aspect of the invention, there is provided a nozzle plate fabricated according to any of the methods described above.

According to a fourth aspect of the invention, there is provided an apparatus for improving the yield of a nozzle plate fabrication process, the apparatus comprising means for determining a variation in the size of nozzles in a fabricated nozzle plate from a predetermined size or range of sizes, the nozzles in the nozzle plate having been fabricated using a plurality of mandrels, each mandrel defining a respective nozzle in the nozzle plate; and means for determining modifications to the size of one or more mandrels in the plurality of mandrels to compensate for the determined variation in the size of nozzles in the nozzle plate.

Particular embodiments of the apparatus according to the invention provide means for implementing the method steps described above.

A fifth aspect of the invention provides a computer program product comprising computer-readable code embodied therein, the computer-readable code being configured such that, on execution by a suitable computer or processor, the computer or processor performs the steps of determining a variation in the size of nozzles in a fabricated nozzle plate from a predetermined size or range of sizes, the nozzles in the nozzle plate having been fabricated using a plurality of mandrels, each mandrel defining a respective nozzle in the nozzle plate; determining modifications to the size of one or more mandrels in the plurality of mandrels to compensate for the determined variation in the size of nozzles in the nozzle plate.

Particular embodiments of the computer program product according to the invention provide further code configured to implement the method steps and/or control the apparatus described above.

A sixth aspect of the invention provides a method of determining a variation in the size of nozzles across a nozzle plate, the method comprising illuminating a nozzle plate with light; detecting the light transmitted through a plurality of nozzles in the nozzle plate; and analyzing the detected light to determine a variation in the size of the nozzles across the nozzle plate.

BRIEF DESCRIPTION OF THE DRAWINGS

Exemplary embodiments of the invention will now be described, by way of example only, with reference to the following drawings, in which.

DETAILED DESCRIPTION OF THE PREFERRED EMBODIMENTS

Figure 1:
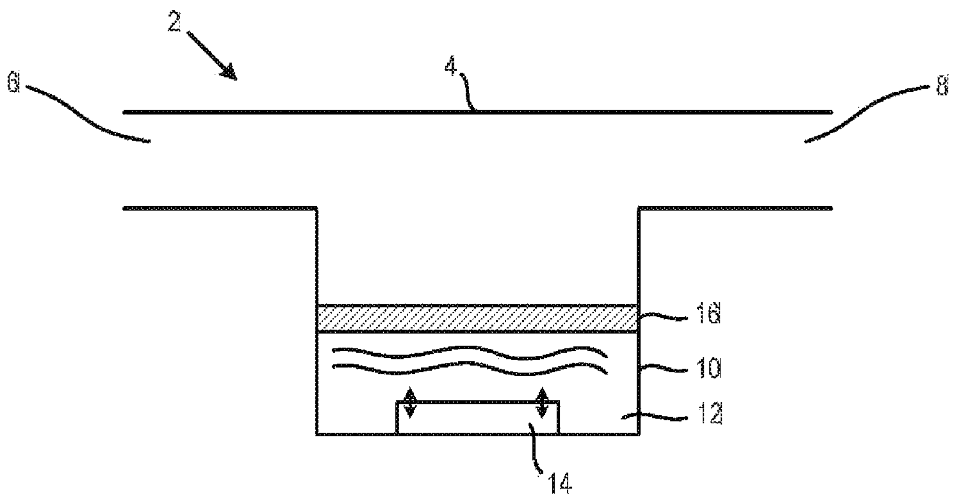
Figure 1 PRIOR ART
FIG. 1 is a block diagram of an exemplary nebulizer comprising a nozzle plate.

As described above, in the conventional nozzle plate fabrication process, precise control is exerted over the processing conditions in an attempt to equalize these conditions for all nozzles being formed on a substrate. However, as illustrated above, even a variation of 2% in the thickness t of the metal layer 18 from a desired thickness or in the thickness across the nozzle plate (which itself is difficult to achieve in practice) leads to unacceptable variations in nozzle size. In these conventional processes, the mandrels 22 used to form each nozzle 24 are a uniform size across the nozzle plate 16 and across all of the nozzle plates 16 fabricated on a substrate 20 in a single process.

However, the inventors have recognized that adjusting or modifying the size of the mandrels 22 used to form the nozzles 24 to account for the local variations in the growth or deposit of the metal layer 18 is a much more effective way of addressing the problems with the low yield of the nozzle plate fabrication process. In particular, in preferred embodiments of the invention, the mandrels 22 are formed using a photolithographic technique, which means that it is relatively easy to make micro-meter scale modifications to portions of the photolithographic mask and thus adjust the size of the resulting mandrels 22 in order to produce nozzles 24 in the required size range.

A method according to the invention will now be described with reference to the flow chart in FIG. 3 and the illustrations in FIGS. 4A-E.

In step 101, a mask is created for use in forming a plurality of mandrels 22 on a substrate 20. The mandrels 22 will be generally circular (in the plane of the substrate 20) and therefore the mask will comprise a corresponding plurality of generally circular holes arranged in an appropriate pattern for forming a nozzle plate 16. At this stage of the fabrication procedure, all of the holes in the mask are preferably the same size, with the size of the holes being determined according to the desired size of the nozzles 24 and the amount of overgrowth of the metal layer 18 in the nozzle plate fabrication process.

Figure 2:
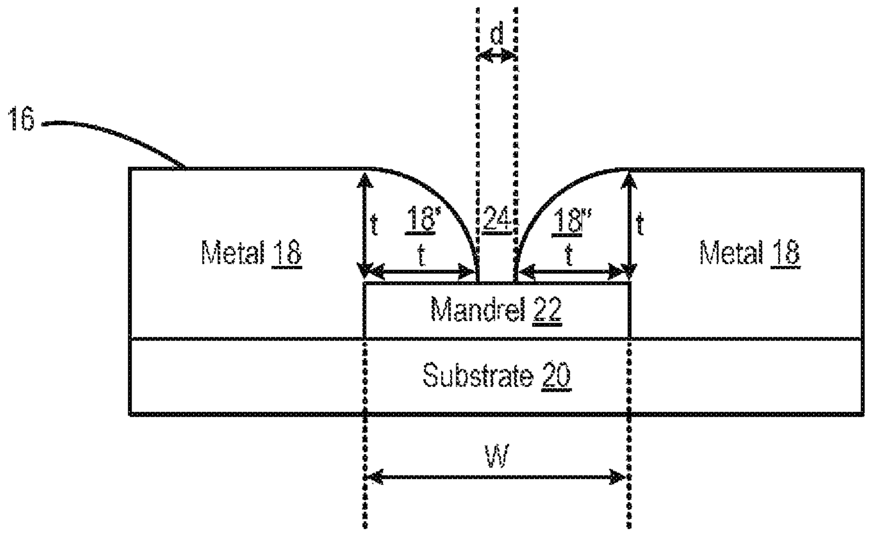
Figure 2 PRIOR ART
FIG. 2 is a cross section of a nozzle formed in a nozzle plate by a mandrel.

For example, where it is desired to fabricate a nozzle plate 16 having nozzles 24 with a diameter of 2.5 μm and the overgrowth thickness t of the metal layer 18 on the mandrel 22 is 30 μm, it can be seen from FIG. 2 that mandrels 22 having a diameter of 62.5 μm are required. Therefore, the mask will define holes having a diameter of 62.5 μm at each point where a mandrel 22 and thus nozzle 24 is desired on the substrate 20.

The mask is preferably a photolithographic mask and is for use in fabricating mandrels 22 in a photolithographic process for single or multiple nozzle plates 16 on a particular substrate 20. Typically, a nozzle plate 16 comprises in the region of 5000 individual nozzles 24 and therefore the mask will contain a corresponding number of holes for defining each nozzle plate 16. The mask can be defined as a computer file and then fabricated using techniques known in the art.

Figure 4A:
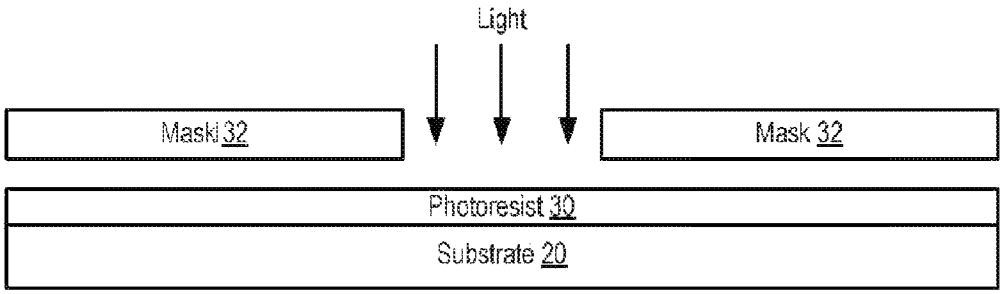
FIGS. 4A, 4B, 4C, 4D and 4E illustrate a process of fabricating a nozzle plate.

In step 103, the mask is used to fabricate the mandrels 22 in the desired positions on a substrate 20. This process step for a single mandrel on a substrate is also illustrated in FIG. 4A. Where the mask (denoted 32 in FIG. 4A) is a photolithographic mask, step 103 comprises applying a photoresist layer 30 to the substrate 20 and shining light through the mask 32 onto the photoresist layer 30. A developer fluid is then used to remove part of the photoresist layer 30, the mandrels 22 being the parts of the photoresist layer 30 remaining on the substrate 20 after application of the developer fluid.

Figure 4B:
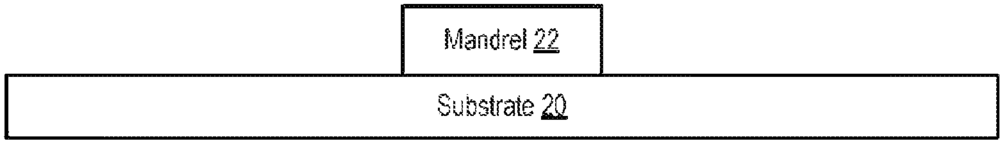

The result of the mandrel fabrication step is shown in FIG. 4B.

Then, in step 105, a nozzle plate 16 is fabricated on the substrate 20 by depositing or growing material on the substrate around and subsequently on the mandrels 22. Preferably, the substrate 20 is either conductive or has a conductive coating on the side on which the mandrels 22 are located, and the material (metal) is deposited on the conductive side of the substrate 20 in an electroforming process. The mandrels 22 are non-conductive, so metal 18 is not deposited directly onto the mandrels 22. The metal 18 can be, for example, platinum, gold, nickel, a nickel-palladium (NiPd) alloy, an iron-palladium (FePd) alloy or a cobalt-palladium (CoPd) alloy.

Figure 4C:
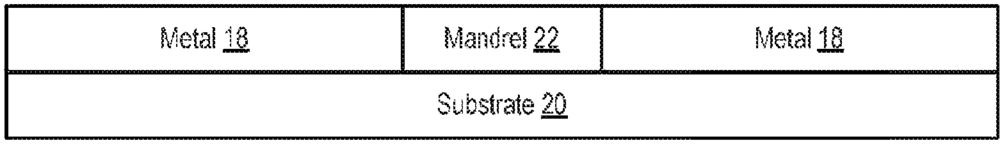

FIG. 4C shows the metal layer 18 being grown or deposited on the substrate 20 during fabrication step 105.

Figure 4D:
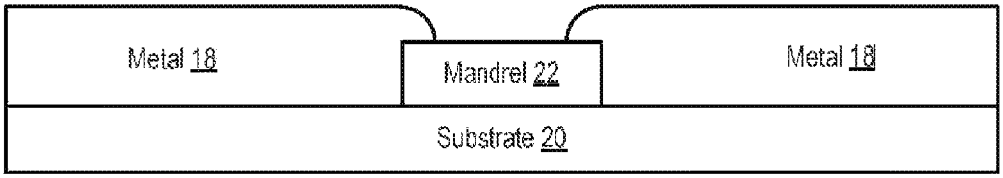
Figure 4E:
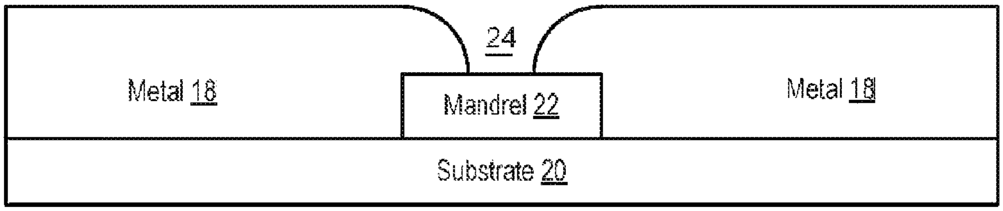

Once the thickness of the metal layer 18 exceeds the height of the mandrel 22 on the substrate 20, further deposited metal 18 'spills over' the top of the mandrel 22, as shown in FIG. 4D. By continuing the growth or deposition of the metal 18, a nozzle 24 is formed in the middle of the mandrel 22, as shown in FIG. 4E. The metal plate 18 forms the structure of the nozzle plate 16. Subsequently, the nozzle plate 16 (metal layer 18) is separated from the substrate 20 and mandrels 22.

Returning to FIG. 3, once the nozzle plate 16 (or multiple nozzle plates on the substrate 20) has been fabricated in step 105 the method passes to step 107 in which a variation in the size of nozzles 24 across the fabricated nozzle plate(s) 16 is measured.

In one embodiment, the variation in size of a number of nozzles 24 is determined by measuring the diameter of various nozzles 24 and comparing the measurements to each other. The measurements can also be compared to a reference value in order to relate the variation in the size of the nozzles 24 to a desired nozzle size or range of sizes for the nozzle 24. In another embodiment, the variation in size of the nozzles 24 is determined by measuring the diameter or size of at least one nozzle 24 and comparing the measured size to a desired size or range of sizes for the nozzle 24. For example, where the nozzle plate 16 is for use in nebulizing a liquid for inhalation, the desired diameter/size can be 2.5 μm, and/or the desired range of diameters/sizes could be 2.25 μm to 2.75 μm (i.e. 2.5 μm±0.25 μm).

In a currently preferred embodiment, the variation in size of a number of nozzles 24 is determined by measuring the amount or intensity of light transmitted by the nozzle 24 (which is dependent on the area of the nozzle 24) and comparing the measured intensities.

As it has been found that there is usually a gradual variation in nozzle size across a nozzle plate and multiple nozzle plates, it is sufficient to measure a subset of the nozzles 24 in a nozzle plate 16, with those measured nozzles 24 being distributed over the nozzle plate 16 in order to provide an indication of the trend in nozzle size variation. In this case, the result of step 107 can be an indication of the variation in nozzle size across a nozzle plate 16 and possibly also an indication of the variation in nozzle size across a number of nozzle plates 16 in the same fabrication batch.

For example (and as discussed further below with reference to FIG. 7), a nozzle plate fabrication process can produce nozzle plates 16 having nozzles 24 that decrease in size towards the middle of a circular nozzle plate 16. Furthermore, there can be a general trend in variations in nozzle size across the nozzle plates 16 formed on a single substrate 20. Therefore, in a preferred embodiment, measurements of the size of a subset of the nozzles 24 in a nozzle plate 16 are made, with those measured nozzles 24 being distributed over the nozzle plate 16 to give a view of the trends in nozzle size variation. For example, the size of nozzles 24 can be measured in the middle of the nozzle plate 16 and at various positions around the periphery of the nozzle plate 16. Nozzles 24 in intermediate positions between the periphery and middle of the nozzle plate 16 can also be measured.

Figure 5:
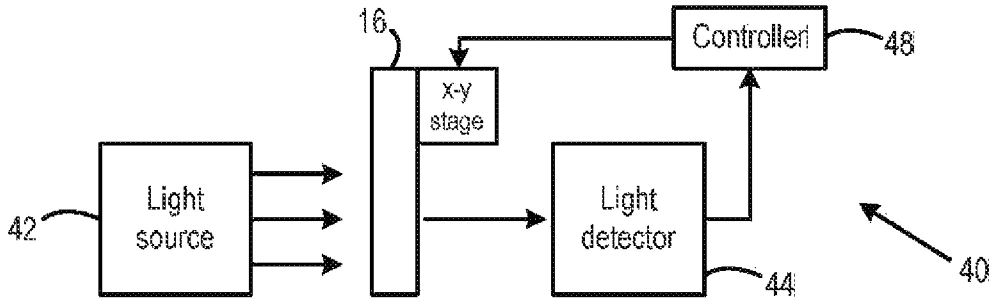
FIG. 5 illustrates an apparatus for measuring the size of one or more nozzles in a fabricated nozzle plate.
Figure 6:
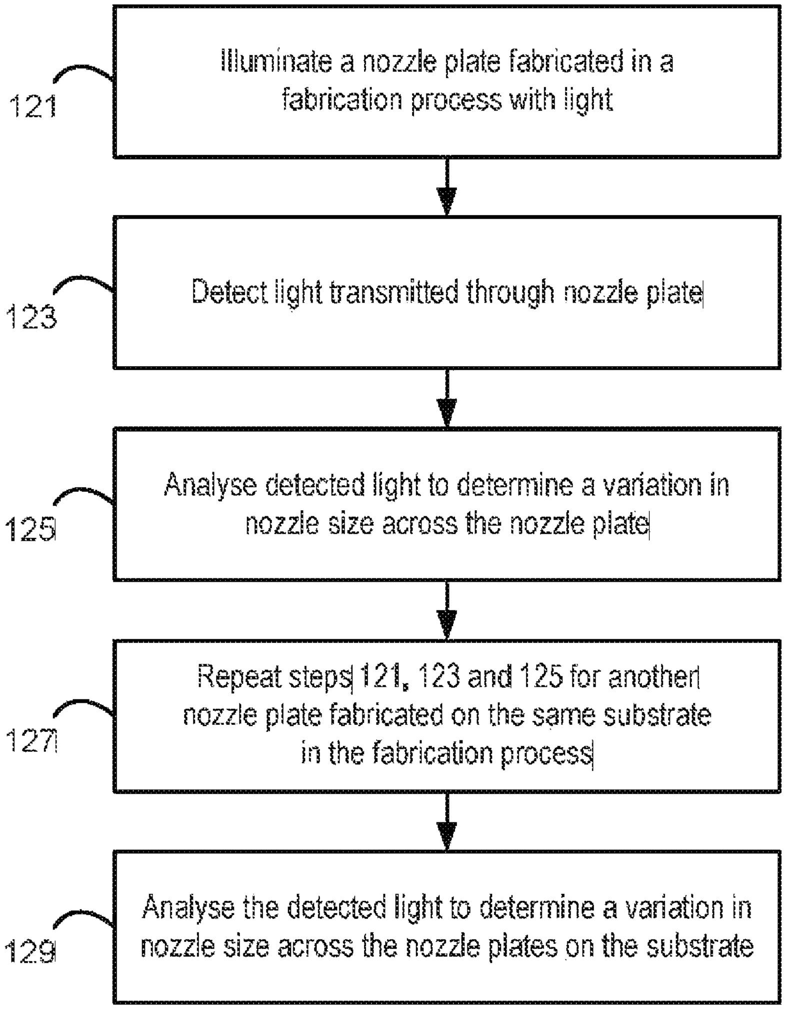
FIG. 6 is a flow chart illustrating a method for measuring the size of one or more nozzles in a fabricated nozzle plate.

FIG. 5 illustrates an apparatus 40 for measuring the size of one or more nozzles 24 in a fabricated nozzle plate 16 in accordance with a preferred embodiment of the invention. A corresponding method for measuring the variation in nozzle size across one or more fabricated nozzle plates 16 is shown in FIG. 6.

The nozzle-size measurement apparatus 40 shown in FIG. 5 comprises a light source 42 that emits light towards a light detector 44. The light source 42 may produce flat diffuse light using a cold cathode fluorescent light with a diffuser, although other types of light source can be used. The light detector 44 may be a digital camera or other suitable device, such as a charge-coupled device (CCD).

The nozzle plate 16 (or metal 18 defining multiple nozzle plates 16) is placed between the light source 42 and light detector 44 so that the light detector 44 can measure the amount or intensity of light transmitted by individual nozzles 24 in the nozzle plate 16.

The nozzle plate or plates 16 may be placed on an x-y stage 46 that is controllable to move the nozzle plate 16 around to enable nozzles 24 in different parts of the nozzle plate 16 to be measured. It has been found that imaging from the exit side (the side in contact with the mandrels 22 and substrate 20 during fabrication) of the nozzle plate 16 is less sensitive to dust, less sensitive to the precise shape of the nozzle 24 and allows the light detector 44 to produce images with higher contrast.

A controller 48 is provided that receives output signals from the light detector 44 and that controls the position of the nozzle plate 16 using the x-y stage 46. The signal output from the light detector 44 can, for example, be an 8-bit pixel brightness value. The controller 46 also analyses the signals from the light detector 44 to determine the size or relative size of the measured nozzles 24. It will be appreciated that measuring the amount of light transmitted by a nozzle 24 provides an indication of the area of the nozzle 24, rather than a direct measurement of its diameter. In some embodiments, the controller 48 can also be responsible for creating the computer file representing the mask 32.

Further optical elements can be present in the apparatus 40 (not shown in FIG. 5), for example a magnification element, such as a microscope, that can be used to magnify the image of the light transmitted by the nozzle plate 16, and an aperture that can be used to limit the light emitted by the light source 42 just to the nozzle plate 16 under test.

Turning now to the flow chart in FIG. 6, the method of measuring the variation in nozzle size across one or more fabricated nozzle plates 16 is shown. The method starts in step 121 in which a nozzle plate 16 or a part of a nozzle plate 16 is illuminated with light from the light source 42. The light transmitted by the nozzles 24 in the nozzle plate 16 is received by the light detector 44 and converted to signals that are output to the controller 48. Steps 121 and 123 are repeated for a number of different areas of the nozzle plate 16.

In step 125, the controller 48 analyses the signals output from the light detector 44 in order to determine the size or relative size of the measured nozzles 24.

In order to identify areas in the image output by the light detector 44 that correspond to nozzles 24, the controller 48 analyses the signals to find pixels (or preferably continuous areas of pixels) having a brightness value in a predetermined range, for example, between 10 and 255 on an 8-bit scale (with 0 representing the lowest brightness value and 255 the highest). Each detected pixel or area of pixels should correspond to an individual nozzle 24.

If a nozzle 24 is found to be transmitting an unexpectedly low amount of light (the precise amount being classified as 'low' depending on the level of magnification and intensity of the light from the light source 42), the data relating to that nozzle 24 can be discarded from the subsequent analysis so that they do not influence the values calculated by the controller 48. These nozzles may be obstructed by debris or have been only partly imaged, for example.

The controller 48 then calculates an average intensity or amount of light transmitted through an identified nozzle 24 or multiple nozzles 24 in an area of the nozzle plate 16 from the signals received from the light detector 44.

Any variation in the size of nozzles 24 across a nozzle plate 16 can be identified by comparing the calculated average intensity for nozzles 24 or groups of nozzles 24 in different areas of the nozzle plate 16.

Figure 7:
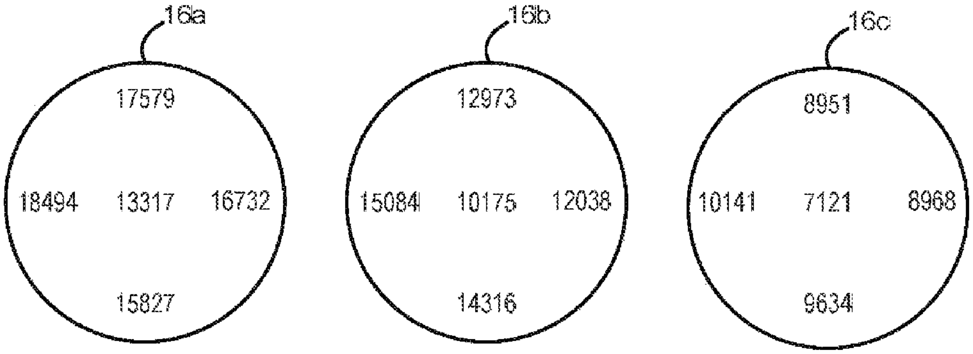
FIG. 7 is a diagram illustrating the results obtained by using the apparatus of FIG. 5 to measure the size of nozzles on three neighboring nozzle plates on a substrate.

FIG. 7 shows the results obtained by using the apparatus of FIG. 5 to measure the size of nozzles on three neighboring nozzle plates 16*a*, 16*b* and 16*c* on a substrate 20. The numbers shown on the nozzle plates 16*a-c* represent the measured light intensity for a nozzle 24 located in that part of the nozzle plate 16*a-c* (i.e. one measurement in the middle of the nozzle plate 16 and four measurements around the periphery of the nozzle plate 16. A relatively low number represents a relatively low average light intensity and therefore a relatively small nozzle 24.

Thus, after calculating the average intensity for nozzles 24 on nozzle plate 16*a*, the controller 48 will compare the average intensity for the different areas of the nozzle plate 16*a* and identify that the average intensity of transmitted light is much lower in the middle of the nozzle plate 16*a* than at the periphery. In addition, the comparison by the controller 48 will show that the average intensity of the light transmitted falls when moving generally from left to right across the nozzle plate 16*a*. The variation can be given by the dividing the highest calculated average in the nozzle plate 16 by the lowest calculated average.

After identifying any variation in the size of nozzles 24 in a nozzle plate 16, the controller 48 can repeat steps 121, 123 and 125 for another nozzle plate 16 fabricated on the same substrate 20 in the fabrication process of step 105, for example for nozzle plates 16*b* and/or 16*c* in FIG. 7 (step 127 of FIG. 6).

Once the light intensities for multiple nozzle plates 16 have been calculated, the controller 48 can analyze the average light intensities to identify a variation in the size of nozzles 24 across the batch of nozzle plates 16. For example, an analysis of the light intensities shown for nozzle plates 16*a*, 16*b* and 16*c* of FIG. 7 shows that there is a general trend of reducing light intensity when moving from left to right on the substrate 20 (i.e. from nozzle plate 16*a* to nozzle plate 16*c*). This variation can be identified by taking an average of the calculated average intensities for each nozzle plate 16, averaging the averages for each nozzle plate 16 to obtain an average for the batch, and the batch variation can be obtained by dividing the average for a particular nozzle plate 16 by the batch average. Alternatively, the batch variation can be obtained by dividing the highest calculated average for a nozzle plate 16 by the lowest calculated average for a nozzle plate 16.

It will be noted that the above process provides an indication of the relative variation of the nozzle size across a nozzle plate 16 and nozzle plates 16 in a batch. In order to relate this variation to the actual size of the nozzles 24 relative to a desired size for the nozzles 24, a calibration procedure can be performed prior to use of the method in FIG. 6. This calibration procedure involves directly measuring the size (area or diameter) of one or more nozzles 24 (using, for example, a scanning electron microscope) and comparing this to the light intensity for those nozzles 24 measured using the apparatus 40.

In the alternative embodiment where the size of nozzles 24 in a nozzle plate 16 are measured directly, the apparatus 40 can simply comprise an optical microscope, scanning electron microscope, an interferometer or other surface topology measurement device. Those skilled in the art will appreciate that it is also possible to measure the size of nozzles 24 in a nozzle plate 16 by measuring the size of droplets generated by the nozzle plate 16 when it is in use.

Thus, the apparatus of FIG. 5 and the method of FIG. 6 provides a quick and non-destructive method of analyzing a nozzle plate 16 and/or a batch of nozzle plates 16 to determine the variation in the size of the nozzles 24.

Returning now to FIG. 3, after the variation in the size of the nozzles 24 across a nozzle plate 16 and/or across a batch of nozzle plates 16 has been determined, the size of the mandrels 22 are modified as appropriate to compensate for the determined variation. Where the mandrels 22 are fabricated using a photolithographic technique, the size of the mandrels 22 can be modified by making corresponding modifications to the parts of the mask 32 used to fabricate those mandrels 22.

In particular, the diameter of a particular mandrel 22 or set of mandrels 22 is adjusted by an amount equal to the amount by which the diameter of the nozzle 24 or nozzles 24 differ from the desired diameter. In particular, if the diameter of a fabricated nozzle 24 is undersized by an amount x as a result of the local variation in metal layer 18 'spill over', the diameter of the corresponding mandrel 22 can be increased by the amount x to compensate. The diameter of a mandrel 22 will be decreased where the diameter of the corresponding nozzle 24 is too large.

For example, if in step 107 the measurement of the variation shows that a particular nozzle 24 or region of nozzles 24 (for example in the middle of a nozzle plate 16 as shown in FIG. 7) is 20% too small, i.e. they have a diameter of 2 μm instead of 2.5 μm, this can be corrected by using mandrels for those nozzle(s) 24 that have a diameter that is 0.5 μm larger than the standard size mandrel 22 in the nozzle plate fabrication process. Thus, where the mandrel 22 has a width of 62.5 μm in the initial nozzle plate fabrication step (step 105) expecting an overgrowth of 30 μm and a nozzle 24 having a diameter of 2 μm is fabricated, the diameter of the mandrel 22 can be increased to 63 μm for subsequent fabrication processes in order to produce a nozzle 24 having the desired size of 2.5 μm.

It will be appreciated that due to the variation in nozzle size across a nozzle plate 16 and multiple nozzle plates 24 in a batch, the modifications to the mandrels 22 will result in the mandrels 22 having a non-uniform size across the substrate 20.

It will be appreciated that step 109 can comprise modifying the actual mask 32 used in step 103 or, preferably, repeating step 101 and creating a new mask 32 for fabricating the mandrels 22 with the desired sizes.

Once the modifications to the size of the mandrels 22 (or more particularly the mask 32 used to fabricate the mandrels 22) have been made, a further nozzle plate 16 or batch of nozzle plates 16 are fabricated using the modified mandrels 22 (step 111).

Provided that the process conditions used in the nozzle plate fabrication process are consistent with those used in step 105 (i.e. materials used, growth time, etc.), the further nozzle plate 16 should be formed with substantially all of the nozzles 24 having a size within the required tolerance. The modified mask 32 can then be used for all subsequent nozzle plate fabrication processes.

Figure 3:
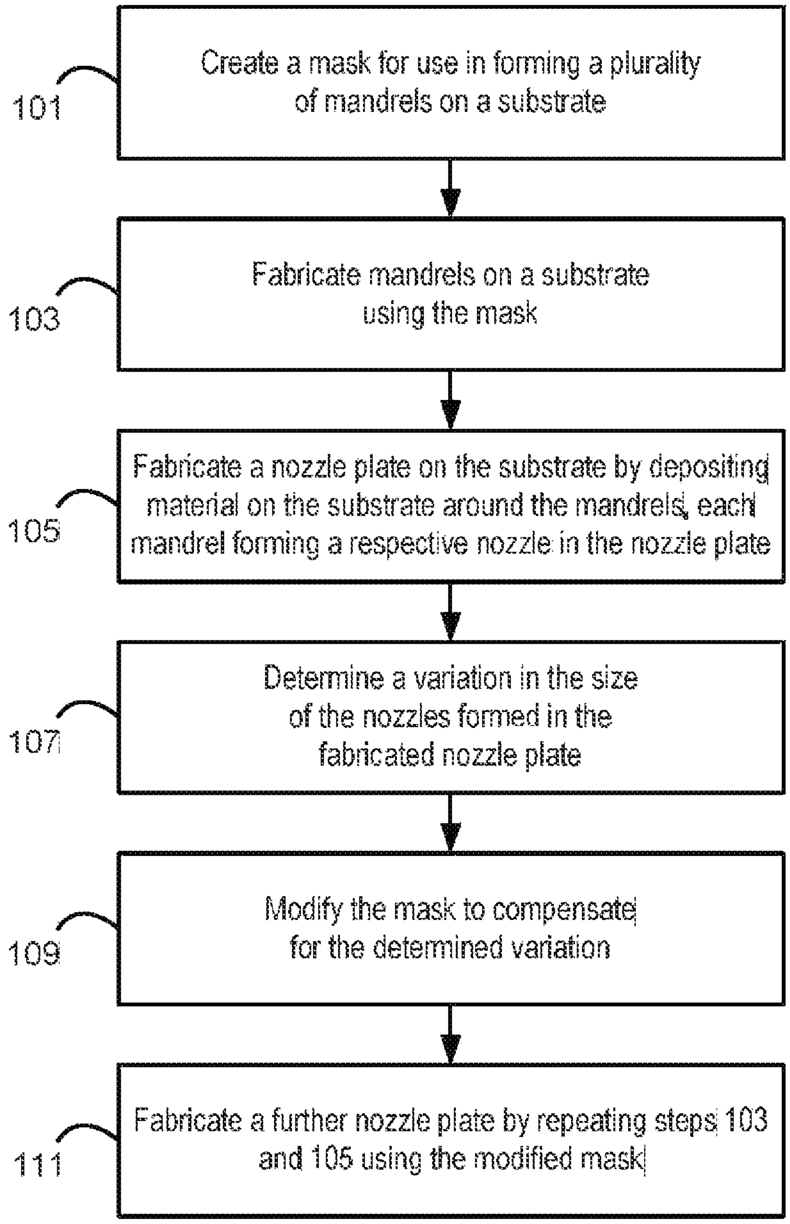
FIG. 3 is a flow chart illustrating the steps in the method according to an embodiment of the invention.

If desired, step 107 of FIG. 3 can be repeated after step 111 to check that the nozzles 24 in the further nozzle plate 16 or further batch of nozzle plates 16 are the correct size. If not, further modifications to the mandrels 22 can be made.

Figure 8A:
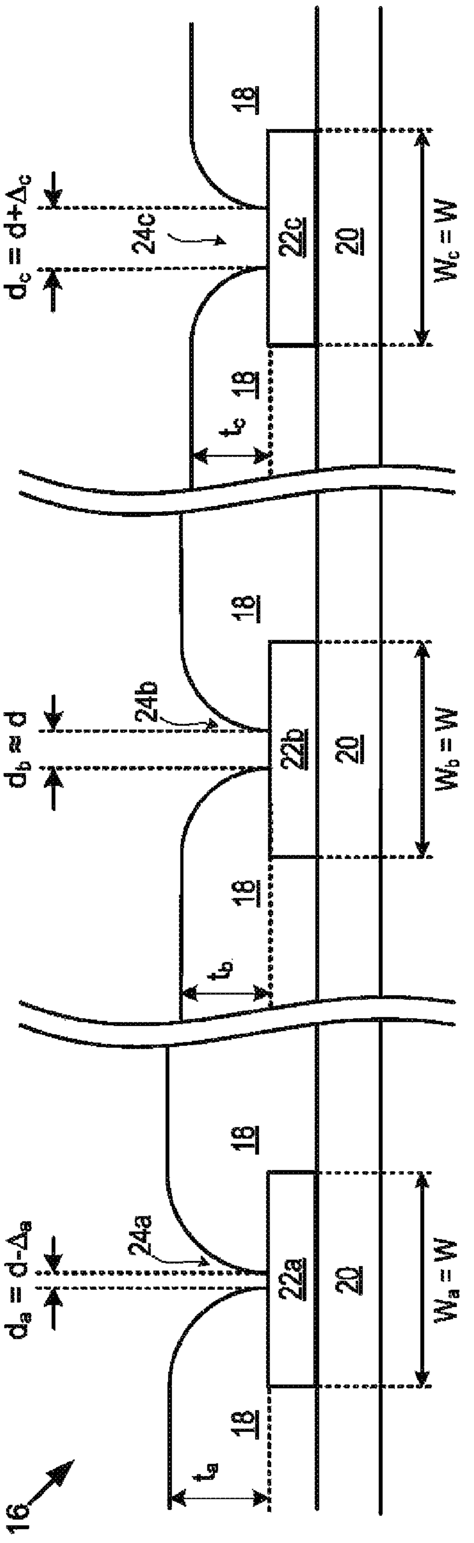
FIG. 8A is diagram illustrating a nozzle plate fabricated in step 105 of FIG. 3.
Figure 8B:
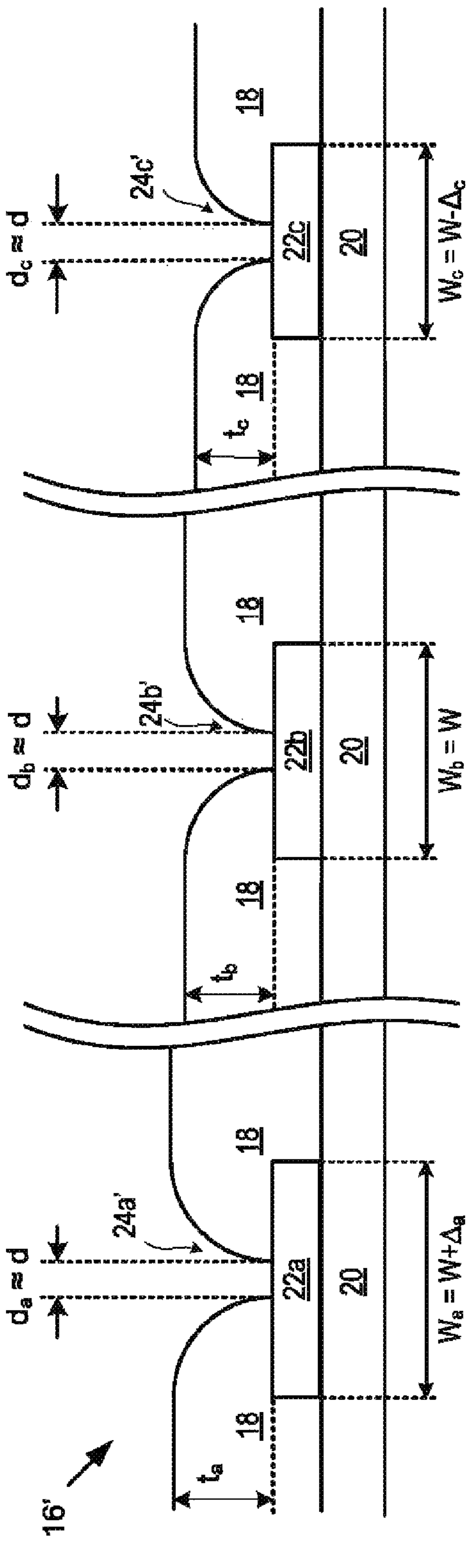
FIG. 8B is a diagram illustrating a nozzle plate according to the invention fabricated in step 111 of FIG. 3.

FIGS. 8A and 8B show a comparison between a nozzle plate fabricated at step 105 of FIG. 3 and a nozzle plate fabricated using the modified mandrels 22/mask 32 in step 111.

FIG. 8A shows three parts of a nozzle plate 16 having respective nozzles **24*a*, 24*b* and 24*c* following fabrication. Each nozzle 24 was fabricated using a respective mandrel 22*a*, 22*b* and 22*c* having the same width ($W_a=W_b=W_c=W$). However, due to local variations in the thickness of the metal layer 18, which decreases in thickness when moving from left to right in the Figure (i.e. $t_a>t_b>t_c$), the nozzles 24*a*, 24*b* and 24*c*** have different diameters and they increase in size when moving from left to right in the Figure (i.e. $d_a<d_b<d_c$).

In this example, it is assumed that the second nozzle **24*b* is within the desired tolerance, i.e. $d_b \approx d$, where d is the desired nozzle diameter, and the first nozzle 24*a* and third nozzle 24*c*** vary from the desired value by respective amounts $\Delta_a$ and $\Delta_c$ which exceed the acceptable tolerance for the nozzles.

Thus, in accordance with the invention, the size of mandrels **22*a* and 22*c* used to form nozzles 24*a* and 24*c* respectively are modified to compensate for the local variations in the thickness of the metal layer 18 obtained in the fabrication process. In particular, the width of mandrel 22*a* is modified to $W_a=W+\Delta_a$ and the width of mandrel 22*c* is modified to $W_c=W-\Delta_c$. The width $W_b$ of mandrel 22*b*** is maintained at W.

FIG. 8B shows three parts of a nozzle plate 16' having respective nozzles **24*a*', 24*b*' and 24*c*' that have been fabricated using the modified mask 32/mandrels 22. Thus, it can be seen that the modifications to the size of the mandrels 22*a* and 22*c* compensate for the local variations in the metal layer 18 resulting in the size of nozzles 24*a*' and 24*c*'** being well within the required tolerance (in fact $d_a$ and $d_c \approx d$).

Although the invention has been described and illustrated above in terms of increasing or decreasing the width of the mandrels 22, it will be appreciated that similar changes to the size of the fabricated nozzles 24 can be achieved by modifying the height of the mandrels 22 on the substrate 20 while maintaining the other parameters of the fabrication process. In particular, increasing the height of a mandrel 22 will mean that the metal layer 18 overspills the mandrel 22 by a smaller amount, and therefore results in a larger nozzle 24. Likewise, reducing the height of a mandrel 22 means that the metal layer 18 overspills the mandrel 22 by a larger amount, and therefore results in a smaller nozzle 24. Those skilled in the art will be aware of techniques that can be used to modify the height of mandrels 22 as described above.

Nozzle plates fabricated according to the invention can be identified by an examination of the exit side of the nozzle plate 16 (the side in contact with the mandrels 22 and substrate 20 during fabrication) since the mandrels 22 leave an 'imprint' in the nozzle plate 16. For example, a nozzle plate 16 having nozzles 24 of a uniform size or within a generally uniform size range that have corresponding mandrel imprints of differing sizes as a result of the mandrel modification according to the invention.

Although the invention has been described herein in terms of a nozzle plate comprising a plurality of nozzles, it will be appreciated that a nozzle plate can also be referred to as a "mesh", "mesh plate" or "nebulizing element" comprising a plurality of nozzles or holes.

It will be appreciated that the above description of the invention is generally concerned with the fabrication of nozzles that are generally the same size across the nozzle plate. However, it will also be appreciated that the invention is equally applicable to nozzle plates where there is an intended variation in the size of the nozzles across the nozzle plate, for example it may be intended for the nozzles at the periphery of a nozzle plate to be larger than the nozzles at the centre. In this case, the local variations in the fabrication process still result in the size of the nozzles differing from the desired value or range of values, and this can be corrected by adjusting the size of the relevant mandrels used in the fabrication process as described above.

There is therefore provided a method for improving the yield of a nozzle plate fabrication process and an apparatus for implementing the same.

While the invention has been illustrated and described in detail in the drawings and foregoing description, such illustration and description are to be considered illustrative or exemplary and not restrictive; the invention is not limited to the disclosed embodiments.

Variations to the disclosed embodiments can be understood and effected by those skilled in the art in practicing the claimed invention, from a study of the drawings, the disclosure and the appended claims. In the claims, the word "comprising" does not exclude other elements or steps, and the indefinite article "a" or "an" does not exclude a plurality. A single processor or other unit may fulfill the functions of several items recited in the claims. The mere fact that certain measures are recited in mutually different dependent claims does not indicate that a combination of these measures cannot be used to advantage. A computer program may be stored/distributed on a suitable medium, such as an optical storage medium or a solid-state medium supplied together with or as part of other hardware, but may also be distributed in other forms, such as via the Internet or other wired or wireless telecommunication systems. Any reference signs in the claims should not be construed as limiting the scope.

The invention claimed is:

1. A method of improving the yield of a nozzle plate fabrication process, the method comprising:

determining a variation in a size of nozzles in a nozzle plate from a predetermined size or range of sizes for the nozzles, the nozzles in the nozzle plate having been fabricated using a plurality of mandrels, each mandrel defining a respective nozzle in the nozzle plate; and determining modifications to a size of one or more mandrels in the plurality of mandrels to compensate for the determined variation in the size of nozzles in the nozzle plate.

2. The method as claimed in claim 1, wherein the step of determining modifications comprises increasing the size of one or more mandrels that define nozzles having a size below the predetermined size or range of sizes and decreasing the size of one or more mandrels that define nozzles having a size above the predetermined size or range of sizes.

3. The method as claimed in claim 1, wherein the step of determining modifications comprises determining an amount by which to increase or decrease the size of the one or more mandrels as that corresponding to the amount by which the respective nozzle in the nozzle plate differs from the predetermined size or range of sizes for the nozzle.

4. The method as claimed in claim 1, wherein the mandrels are formed on a substrate using a mask, the step of determining modifications comprises determining modifications to the mask used to form the mandrels.

5. The method as claimed in claim 4, wherein the step of determining modifications comprises determining modifications to an area of the mask corresponding to the relevant mandrel.

6. The method as claimed in claim 1, wherein the step of determining a variation in the size of nozzles in the nozzle plate comprises:

illuminating the nozzle plate with light; detecting the light transmitted through one or more nozzles in the nozzle plate; and analyzing the detected light to determine a size of the one or more nozzles.

7. The method as claimed in claim 6, wherein the step of detecting comprises detecting the light transmitted through a plurality of nozzles in the nozzle plate, the plurality of nozzles being distributed across the nozzle plate; and wherein the step of analyzing the detected light comprises analyzing the light detected for each of the plurality of nozzles to determine the variation in the size of the plurality of nozzles across the nozzle plate.

8. The method as claimed in any preceding claim 1, the method further comprising the step of: fabricating the nozzle plate having a plurality of nozzles using the plurality of mandrels on a substrate, wherein at least one of the plurality of mandrels having the size as determined in the step of determining modifications.

9. An apparatus for improving the yield of a nozzle plate fabrication process, the apparatus comprising: means for determining a variation in a size of nozzles in a fabricated nozzle plate from a predetermined size or range of sizes, the nozzles in the nozzle plate having been fabricated using a plurality of mandrels, each mandrel defining a respective nozzle in the nozzle plate; and means for determining modifications to a size of one or more mandrels in the plurality of mandrels to compensate for the determined variation in the size of nozzles in the nozzle plate.

* * * * *